United States Patent
Aoto et al.

(10) Patent No.: US 6,783,588 B2
(45) Date of Patent: Aug. 31, 2004

(54) BATIO₃–PBTIO₃ SERIES SINGLE CRYSTAL AND METHOD OF MANUFACTURING THE SAME PIEZOELECTRIC TYPE ACTUATOR AND LIQUID DISCHARGE HEAD USING SUCH PIEZOELECTRIC TYPE ACTUATOR

(75) Inventors: Hiroshi Aoto, Kanagawa (JP); Akira Unno, Kanagawa (JP); Tetsuro Fukui, Kanagawa (JP); Akio Ikesue, Aichi (JP)

(73) Assignee: Canon Kabushiki Kaisha, Tokyo (JP)

( * ) Notice: Subject to any disclaimer, the term of this patent is extended or adjusted under 35 U.S.C. 154(b) by 113 days.

(21) Appl. No.: 10/014,355

(22) Filed: Dec. 14, 2001

(65) Prior Publication Data

US 2002/0158224 A1 Oct. 31, 2002

(30) Foreign Application Priority Data

Dec. 15, 2000  (JP) ........................................ 2000-381522

(51) Int. Cl.⁷ ................................................ C30B 1/02
(52) U.S. Cl. ............................................................ 117/4
(58) Field of Search ........................................ 117/3, 4

(56) References Cited

U.S. PATENT DOCUMENTS

| | | | | |
|---|---|---|---|---|
| 4,339,301 A | * | 7/1982 | Matsuzawa et al. | 156/603 |
| 4,519,870 A | * | 5/1985 | Matsuzawa et al. | 156/603 |
| 4,640,905 A | * | 2/1987 | Burn | 501/137 |
| 4,661,462 A | * | 4/1987 | Sakabe et al. | 501/134 |
| 4,900,393 A | * | 2/1990 | Kugimiya et al. | 156/600 |
| 5,272,341 A | * | 12/1993 | Michili et al. | 250/338.3 |
| 5,304,226 A | * | 4/1994 | Hasegawa et al. | 51/309 |
| 6,020,675 A | | 2/2000 | Yamashita et al. | 310/658 |
| 6,048,394 A | * | 4/2000 | Harmer et al. | 117/8 |

FOREIGN PATENT DOCUMENTS

| | | |
|---|---|---|
| JP | 59-3091 | 1/1984 |
| JP | 62-30687 | 2/1987 |
| JP | 4-3200296 | 10/1992 |
| JP | 5-155696 | 6/1993 |
| JP | 5-155697 | 6/1993 |
| JP | 6-321698 | 11/1994 |
| JP | 9-59096 | 3/1997 |
| JP | 9-188597 | 7/1997 |
| JP | 9-163496 | 10/1997 |

OTHER PUBLICATIONS

Hexagonal–phase retention in pressureless–sintered barium titanate, Philosophical Magazine A, vol. 81, No. 1, pp 181–196, 2001.*

* cited by examiner

*Primary Examiner*—Nadine G. Norton
*Assistant Examiner*—Matthew Anderson
(74) *Attorney, Agent, or Firm*—Fitzpatrick, Cella, Harper & Scinto

(57) ABSTRACT

$BaTiO_3$—$PbTiO_3$ series single crystal is single-crystallized by heating $BaTiO_3$—$PbTiO_3$ compact powder member or sintered member having a smaller Pb-containing mol number than Ba-containing mol number, while keeping the powder or substance in non-molten condition. In this way, this single crystal can be manufactured at a crystal growing speed faster still and stabilized more, significantly contributing to improving the dielectric loss and electromechanical coupling coefficient for the provision of excellent $BaTiO_3$—$PbTiO_3$ series single crystal in various properties, as well as for the provision of piezoelectric material having a small ratio of lead content, which is particularly excellent in piezoelectric property and productivity.

12 Claims, 4 Drawing Sheets

BATIO$_3$–PBTIO$_3$ SERIES SINGLE CRYSTAL AND METHOD OF MANUFACTURING THE SAME PIEZOELECTRIC TYPE ACTUATOR AND LIQUID DISCHARGE HEAD USING SUCH PIEZOELECTRIC TYPE ACTUATOR

BACKGROUND OF THE INVENTION

1. Field of the Invention

The present invention relates to the BaTiO$_3$—PbTiO$_3$ series single crystal that can be utilized as a piezoelectric element, for example, and also, relates to the method of manufacturing the same. Further, the invention relates to a piezoelectric type actuator formed by the BaTiO$_3$—PbTiO$_3$ series single crystal, and the liquid discharge head that uses such piezoelectric type actuator as well.

2. Related Background Art

The BaTiO$_3$ series single crystal is a nonlinear optical crystal utilized for optical communications, information processing, or the like, and having a great marketability, which is not only used as a phase conjugate wave generating medium for a high resolution image processing, a real-time hologram, or a laser resonator, but also, used as a highly capable piezoelectric material if the crystallization thereof can be implemented at lower costs.

Now, obviously, the composition of the BaTiO$_3$ makes it difficult to obtain single crystal directly from the BaTiO$_3$ solution when BaTiO$_3$ series single crystal is manufactured. Therefore, only the flux growth that uses solution (flux) having fluoride and chloride as main component or the method, in which the BaTiO$_3$ series single crystal of low-temperature component is picked up directly by making the composition of the solution TiO$_2$ rich (the so-called top seeded solution growth (TSSG method)), is applicable to the growth thereof. With the flux growth, the obtainable size is only 1 mm$^3$ or less approximately. Also, for the TSSG method, not only an expensive noble metal crucible, such as a platinum crucible, is needed, but the growing speed is slow to make the manufacturing costs extremely high.

Conventionally, it has been attempted to provide a method for manufacturing larger BaTiO$_3$ series single crystal more effectively and easily with the improvement of the aspects that present the problems as described above.

For example, there are experiments carried out in manufacturing BaTiO$_3$ series single crystal efficiently by sintering method. In the specifications of Japanese Patent Application Laid-Open Nos. 4-300296, 5-155696 and 5-155697, a method for manufacturing BaTiO$_3$ series single crystal is disclosed, in which the BaTiO$_3$ series single crystal serving as the seed crystal is coupled with the BaTiO$_3$ polycrystal, and heated to mono-crystalize such polycrystal by means of solid-phase reaction. In the specification of Japanese Patent Application Laid-Open No. 9-263496, a method for manufacturing BaTiO$_3$ series single crystal is disclosed, in which a temperature gradient is given to the BaTiO$_3$ micro-crystal granular aggregate, the mol ratio of Ti/Ba of which is 1.0 or more and 1.1 or less, for the execution of single crystallization thereof. With these methods, however, the mono-crystalline growth rate greatly varies to make it impossible to grow any bulky single crystal with good reproducibility. Also, the rearrangement density is high, and the crystallinity of the BaTiO$_3$ series single crystal thus obtained is inferior to the one obtained by the conventional TSSG method and the flux method. There are also the examples of solid-phase methods other than the sintering method. In the specification of Japanese Patent Application Laid-Open No. 59-3091, there is the disclosure of a method for manufacturing the oxide single crystal, in which a crystal oxide, such as PbTiO$_3$, BaTiO$_3$, SrTiO$_3$, CaTiO$_3$, is quenched and solidified after molten to make it amorphous, and then, re-crystallized under a temperature gradient. This method makes the manufacturing apparatus and process complicated, because there is a need for a process to melt the crystal oxide. Also, the single crystal thus obtained has inferior crystallization properties, and only the crystal that has a high ratio of pore content is obtainable eventually.

Also, improvement studies have been made on the TSSG method and the flux method. In the specification of Japanese Patent Application Laid-Open No. 6-321698, there is disclosed, as the flux method, a method for manufacturing BaTiO$_3$ using a mixed substance of BaF$_2$, NaF, Li$_2$MoO$_4$, or the like as flux. In this method, the solubility of BaTiO$_3$ is enhanced for the purpose of obtaining bulky BaTiO$_3$ series single crystal with a long-time crystal growth. However, this method is not fully satisfactory in terms of the time required for manufacturing and costs. In the specification of Japanese Patent Application Laid-Open No. 9-59096, there is disclosed BaTiO$_3$ series single crystal having the doping of fine quantities of Mg and Fe. This material aims at obtaining a high photo-refractivity in the near infrared range, but Mg, Fe, or some other element, which may exert unfavorable influence on the piezoelectric property, is contained in that material. As a result, it is not preferable to use this as a piezoelectric material. Also, for the utilization at the industrial level, it is not satisfactory in terms of the time required for manufacture and costs.

As described above, the TSSG or flux method for manufacturing BaTiO$_3$ series single crystal makes it extremely difficult to improve problems related to manufacturing efficiency, such as the time required for manufacturing and costs, among some others. Here, although the sintering method is anticipated to enhance the manufacturing efficiency, the variation of growing speed of BaTiO$_3$ series single crystal makes it impossible to obtain any satisfactory result, and also, the crystallinity of the BaTiO$_3$ series single crystal thus obtained is inferior to the one obtainable by means of TSSG or flux method. In other words, it has been difficult to implement the manufacture of BaTiO$_3$ series single crystal having excellent crystallinity and property in a shorter period of time at lower costs.

SUMMARY OF THE INVENTION

For the formation of BaTiO$_3$ series single crystal by sintering method, the inventors hereof have attempted to make the enhancement of the reproducibility of single crystal growth compatible with the enhancement of crystallinity and other substances by adding other component to BaTiO$_3$ itself. With this in view, the inventors hereof have studied assiduously, with the result that a system, in which PbTiO$_3$ is added to BaTiO$_3$, is found to enable a crystallization growth to occur with an extremely fine reproducibility, satisfied only with a predetermined condition Therefore, the studies have been made further in detail on the BaTiO$_3$—PbTiO$_3$ system to design the present invention completely.

The inventors hereof have measured the crystallinity of the BaTiO$_3$—PbTiO$_3$ series single crystal obtained in accordance with the present invention. As a result, it is found that the BaTiO$_3$—PbTiO$_3$ of the present invention is extremely fine in the crystallinity thereof. It is also confirmed by the X-ray diffraction and electron beam diffraction that the crystal orientation of the single crystal is completely coincident. Also, by the observation of etch pit, which will be described later, it is confirmed that the rearrangement density of the crystal is low, and that from this observation, the excellent crystal has a small amount of lattice defect. The ratio of pore content is also extremely small.

Following this, the other properties of the $BaTiO_3$—$PbTiO_3$ series single crystal, such as permittivity, piezoelectric property, and pyroelectric property, among some others, are examined. As a result, it is found that the piezoelectric property is excellent in particular, which is far superior to the property of PZT (Pb (Ti, Zr) $O_3$) polycrystal currently used as standards, or that of $BaTiO_3$ series single crystal manufactured by means of the TSSG method, not to mention that of $BaTiO_3$ polycrystal.

From the viewpoint of the $BaTiO_3$—$PbTiO_3$ series single crystal as a piezoelectric material, it has such advantages as the wide range of temperatures at which it can be used, and the lower amount of lead content that it has attained, as well as the excellent piezoelectric property that it can provide. The curie temperature of $BaTiO_3$ series single crystal is approximately 120° C. ($T_c$). Any element that uses the $BaTiO_3$ series single crystal has a narrow usable temperature range due to low $T_c$ as practical drawbacks. The $BaTiO_3$—$PbTiO_3$ series single crystal of the present invention has a higher curie temperature ($T_c$) than the aforesaid $BaTiO_3$ polycrystal to make it possible to make the range of usable temperature larger.

Also, in order to reduce the load to the environment on earth, it is required to reduce the amount of lead to be used for any industrial product in recent years. As compared with the PZT polycrystal, which presents the main current of piezoelectric material at present, the $BaTiO_3$—$PbTiO_3$ series single crystal of the present invention is found to be able to reduce the use amount of lead significantly owing to the composition that is different therefrom, and further, to enhance the piezoelectric property conspicuously. Also, it has been found that the use amount of piezoelectric material itself, which is needed for producing the same effect, is reduced significantly. At present, it is considered to use $BaTiO_3$ polycrystal, $Bi_{0.5}Na_{0.5}TiO_3$ series single crystal $(Na_{0.5}K_{0.5})NbO_3$ polycrystal as a promising material for substitution of PZT for the purpose of reducing the lead use amount. However, against the PZT piezoelectric constant $d_{33}$=300 to 400 ($\times 10^{-12}$ C/N) and electromechanical coupling coefficient $k_{33}$=0.6 to 0.7, the $BaTiO_3$ polycrystal has the piezoelectric constant $d_{33}$=120 ($\times 10^{-12}$ C/N) and electromechanical coupling coefficient $k_{33}$=0.4 to 0.5, and the $BiO_5Na_{05}TiO_3$ has the piezoelectric constant $d_{33}$=110 ($\times 10^{-12}$ C/N) and electromechanical coupling coefficient $k_{33}$=0.4 to 0.6. Therefore, the piezoelectric property is not satisfactory.

Also, the piezoelectric property of the $BaTiO_3$—$PbTiO_3$ polycrystal is far inferior in terms of a piezoelectric material to that of the PZT polycrystal or the $BaTiO_3$—$PbTiO_3$ series single crystal, and there is no way fundamentally to enhance the piezoelectric property as single crystal. It is also considered more difficult to manufacture $BaTiO_3$—$PbTiO_3$ series single crystal by the method other than the one designed by the present invention, such as the flux method, the TSSG method, or any other melt-solidification method than to manufacture $BaTiO_3$ series single crystal. There is no value that can be found in these methods. As described earlier, regarding the $BaTiO_3$ series single crystal, only the small one, the size of which is approximately 1 $mm^3$ or less, is obtainable by means of the flux method. Also, for the TSSG method, an expensive noble crucible, such a platinum crucible, is needed. In addition, the growing speed is only 0.1 to 0.2 mm/h approximately, leading to an extremely high cost of manufacture. Further, the material loss is great, and there is a drawback that it is difficult to obtain bulky crystal. Such an extremely high cost of manufacture is inevitable to make the field of utilization thereof extremely limited. It has been pointed out that this is valueless as a material of industrial use. On the functional aspect, too, impurities tend to be mixed during the single crystal growing process. There are often the cases where the anticipated performance cannot be demonstrated after all. It is also anticipated that there is the same problem regarding the $BaTiO_3$—$PbTiO_3$ series single crystal if it should be manufactured using the melt-solidification method.

As the example of a method for manufacturing perovskite oxide single crystal, there is the disclosure in the specification of Japanese Patent Application Laid-Open No. 9-188597, in which a process is provided for enabling the perovskite sintered member of Pb $\{(Mg_{1/3}Nb_{2/3})_{1-x}Ti_x\}O_3$ (in the aforesaid composition formula, $0 \leq x \leq 0.55$. Pb of 10 mol % or less may be replaced with Ba, Sr, Ca, or the like) to be in contact with seed crystal, and heated at a temperature of 1,000 to 1,450° C. in the closed container in the lead atmosphere. However, there is no disclosure of the $BaTiO_3$—$PbTiO_3$ series single crystal having a smaller mol number of Pb than that of Ba. There is also no disclosure as to the effect thereof as a matter of course. Also, when the ratio between the A site and B site of the aforesaid perovskite sintered member is 1.00>A/B, the crystallization speed is remarkably slow. This is the tendency that differs from the present invention as described later.

It is an object of the present invention to improve the dielectric loss and electromechanical coupling coefficient, and provide excellent $BaTiO_3$—$PbTiO_3$ series single crystal in various properties, such as permittivity, piezoelectric property, pyroelectric property, and also, to provide $BaTiO_3$—$PbTiO_3$ series single crystal as the piezoelectric material having a small ratio of lead content, which is particularly excellent in piezoelectric property and productivity. It is another object of the invention to provide a method for manufacturing $BaTiO_3$—$PbTiO_3$ series single crystal capable of manufacturing $BaTiO_3$—$PbTiO_3$ series single crystal efficiently, not by means of the single crystal growth using the melt-solidification method. It is still another object of the invention to provide a piezoelectric type actuator using the $BaTiO_3$—$PbTiO_3$ series single crystal, and a liquid discharge head as well.

The $BaTiO_3$—$PbTiO_3$ series single crystal of the present invention is single-crystallized by heating $BaTiO_3$—$PbTiO_3$ compact powder member or sintered member having a smaller Pb-containing mol number than Ba-containing mol number, while keeping the powder or member in non-molten condition. The inventors hereof have found that it becomes possible for the conventional manufacture of $BaTiO_3$ series single crystal by means of the sintering method, which is unable to grow single crystal with good reproducibility, to perform a stable single crystal growth by adding $PbTiO_3$ to $BaTiO_3$ so that the Pb-containing mol number is made smaller than the Ba-containing mol number, hence designing the present invention completely.

It is preferable for the $BaTiO_3$—$PbTiO_3$ series single crystal of the invention that the rearrangement density is $10^2$ pieces/$cm^2$ or more and $10^6$ pieces/$cm^2$ or less, and the ratio of pore content is within a range of 1 volume ppm or more and 5 volume % or less. In this way, the $BaTiO_3$—$PbTiO_3$ series single crystal of the invention makes the dielectric loss smaller, and the electromechanical coupling coefficient larger. For example, the dielectric loss is 1% or less, and the electromechanical coupling coefficient exceeds 85%.

It is preferable for the $BaTiO_3$—$PbTiO_3$ series single crystal of the invention that the ratio of $PbTiO_3$ content is 45 mol % or less in the $BaTiO_3$—$PbTiO_3$ series single crystal. When the ratio of $PbTiO_3$ content in the $BaTiO_3$—$PbTiO_3$ compact powder member or sintered member, which serves as the starting substance, is arranged to be 45 mol % or less, the single crystal growing speed is promoted more to make it possible to manufacture the single crystal substance more stably. Then, the resultant ratio of $PbTi_3$ content in the $BaTiO_3$—$PbTiO_3$ series single crystal is the same as the ratio of $PbTiO_3$ content in the starting substance. It is preferable for the $BaTiO_3$—$PbTiO_3$ series single crystal of the invention that the ratio of $PbTiO_3$ content is 30 mol % or less, and more preferably, it is 25 mol % or less. If the ratio of $PbTiO_3$ content is too much, the evaporation of Pb becomes conspicuous, and composition changes from the target one, while the single crystal thus obtained tends to become porous. In order to suppress the Pb evaporation, it is imperative that a pressurized container be utilized, presenting a disadvantage that the manufacturing costs become higher. Also, the minimum amount of $PbTiO_3$ content in the $BaTiO_3$—$PbTiO_3$ series single crystal of the invention should preferably be 0.01 mol % or more, and more preferably, it is 0.02 mol % or more.

It is preferable for the $BaTiO_3$—$PbTiO_3$ series single crystal of the invention that the volume of the single crystal is 1 $mm^3$ or more. The volume of the $BaTiO_3$—$PbTiO_3$ series single crystal of the invention can easily be made 1 $mm^3$ or more with the stable crystal growth. With the volume of 1 $mm^3$ or more, the single crystal makes it possible to favorably deal with many devices in various sizes due to the area that can be made larger. Also, according to another mode of the present invention, the $BaTiO_3$—$PbTiO_3$ series single crystal is characterized in that the rearrangement density of $10^2$ pieces/$cm^2$ or more and $10^6$ pieces/$cm^2$ or less, and the ratio of pore content being within in a range of 1 volume ppm or more and 5 volume % or less. More preferably, the ratio of $PbTiO_3$ content is 45 mol % or less for the $BaTiO_3$—$PbTiO_3$ series single crystal of the invention. In this way, the $BaTiO_3$—$PbTiO_3$ series single crystal of the invention makes the dielectric loss smaller, and the electromechanical coupling coefficient larger.

Also, the method of the present invention for manufacturing $BaTiO_3$—$PbTiO_3$ series single crystal comprises the step of single-crystallizing $BaTiO_3$—$PbTiO_3$ compact powder member or sintered member having a smaller Pb-containing mol number than Ba-containing mol number by defining the range of the mol ratio of elements contained therein to be $0.9800<(Ba+Pb)/Ti<1.0000$, and by heating, while keeping the powder or substance in non-molten condition. More preferably, the range of the mol ratio of elements contained in the compact powder member or sintered member is defined to be $0.9900<(Ba+Pb)/Ti<1.0000$. Still more preferably, the range of the mol ratio of elements contained in the compact powder member or sintered member is defined to be $0.9950\leq(Ba+Pb)/Ti\leq0.9999$. By heating the $BaTiO_3$—$PbTiO_3$ compact powder member or sintered member having a smaller Pb-containing mol number than Ba-containing mol number, while keeping it in non-molten condition, the reproducibility of single crystal growth is enhanced as compared with the same process of only the $BaTiO_3$ compact powder member or sintered member that does not contain $PbTiO_3$, thus making it possible to manufacture the stable $BaTiO_3$—$PbTiO_3$ series single crystal. Further, by defining the mol ratio of elements contained in the $BaTiO_3$—$PbTiO_3$ series single crystal within a specific range, the crystal growing speed of $BaTiO_3$—$PbTiO_3$ series single crystal becomes faster.

It is preferable for the method of the present invention for manufacturing $BaTiO_3$—$PbTiO_3$ series single crystal that the ratio of $PbTiO_3$ content is 45 mol % or less in the $BaTiO_3$—$PbTiO_3$ compact powder member or sintered member. When the ratio of $PbTiO_3$ content in the $BaTiO_3$—$PbTiO_3$ compact powder member or sintered member, which serves as the starting substance, is arranged to be 45 mol % or less, the single crystal growing speed is promoted more to make it possible to manufacture the single crystal substance more stably. It is preferable for the method of the invention for manufacturing $BaTiO_3$—$PbTiO_3$ series single crystal that the ratio of $PbTiO_3$ content in the $BaTiO_3$—$PbTiO_3$ series single crystal compact powder or sintered member is 30 mol % or less, and more preferably, it is 25 mol % or less. If the ratio of $PbTiO_3$ content is too much, the evaporation of Pb becomes conspicuous, and composition changes from the target one, while the single crystal thus obtained tends to become porous. In order to suppress the Pb evaporation, it is imperative that a pressurized container be utilized, presenting a disadvantage that the manufacturing costs become higher. Also, in the method for manufacturing $BaTiO_3$—$PbTiO_3$ series single crystal, the minimum amount of $PbTiO_3$ content in the $BaTiO_3$—$PbTiO_3$ compact powder member or sintered member should preferably be 0.01 mol % or more, and more preferably, it is 0.02 mol % or more.

It is preferable for the method of the present invention for manufacturing $BaTiO_3$—$PbTiO_3$ series single crystal to comprise the step of single-crystallizing by heating the $BaTiO_3$—$PbTiO_3$ compact powder member or sintered member within a temperature range of 1,200° C. or more and 1,400° C. or less. By heating the $BaTiO_3$—$PbTiO_3$ compact powder member or sintered member within a range of designated temperatures, the crystal growing speed of $BaTiO_3$—$PbTiO_3$ series single crystal becomes faster.

Further, the method of the present invention for manufacturing $BaTiO_3$—$PbTiO_3$ series single crystal comprises the steps of preparing $BaTiO_3$ series single crystal or $BaTiO_3$—$PbTiO_3$ series single crystal as seed crystal; coupling $BaTiO_3$—$PbTiO_3$ series sintered member composed of crystal grain of average granular diameter of 20 $\mu m$ or less, having the relative density of 95% or more, with the {100} plane, {110} plane, or {111} plane of the seed crystal; and single-crystallizing by heating, while keeping the coupled substance in non-molten condition. More preferably, the mol ratio of elements contained in the $BaTiO_3$—$PbTiO_3$ compact powder member or sintered member is within a range of $0.9950\leq(Ba+Pb)/Ti\leq0.9999$. In the method of the invention for manufacturing $BaTiO_3$—$PbTiO_3$ series single crystal, the single crystallization takes place stably from the coupling portion between the compact powder member or sintered member and the seed crystal by use of the $BaTiO_3$—$PbTiO_3$ compact powder member or sintered member coupled with the seed crystal in the aforesaid condition, and the reproducibility of single crystal growth is enhanced. Also, if the mol ratio of elements contained in the aforesaid compact powder or sintered member is within the designated range, the crystal growing speed of $BaTiO_3$—$PbTiO_3$ series single crystal becomes faster still.

It is preferable for the method of the present invention for manufacturing $BaTiO_3$—$PbTiO_3$ series single crystal to comprise the step of single-crystallizing by heating, while keeping the compact powder member or sintered member in the lead atmosphere and in non-molten condition. As one of the methods for forming the lead atmosphere, it is possible to evaporate lead or lead oxide form the lead-contained compound by enabling the lead-contained compound to coexist in the environment in which the $BaTiO_3$—$PbTiO_3$ compact powder member or sintered member is heated, while being kept in non-molten condition. By heating the $BaTiO_3$—$PbTiO_3$ compact powder member or sintered member in the lead atmosphere, it becomes possible to prevent lead, lead oxide, or the like from being evaporated from the $BaTiO_3$—$PbTiO_3$ compact powder member or sintered member or the $BaTiO_3$—$PbTiO_3$ series single crystal. In this way, the increase of rearrangement density and the ratio of pore content in the $BaTiO_3$—$PbTiO_3$ series single crystal can be suppressed, thus making it possible to manufacture high quality $BaTiO_3$—$PbTiO_3$ series single crystal.

Further, the piezoelectric type actuator of the present invention comprises a layer formed by $BaTiO_3$—$PbTiO_3$ series single crystal described earlier. Also, the liquid discharge head of the present invention comprises the aforesaid piezoelectric type actuator. Here, the piezoelectric type actuator and liquid discharge head of the present invention use the $BaTiO_3$—$PbTiO_3$ series single crystal that has high electromechanical coupling coefficient, high piezoelectric constant, and high curie temperature altogether as the piezoelectric material. Thus, the piezoelectric actuator and liquid discharge head can be materialized to provide high output with a wide range of usable temperatures. Also, from the viewpoint of the environmental improvement on earth, it is preferable to use the aforesaid actuator and head, because the amount of lead contented in them is small.

The $BaTiO_3$—$PbTiO_3$ series single crystal of the present invention is single-crystallized by heating $BaTiO_3$—$PbTiO_3$ compact powder member or sintered member having a smaller Pb-containing mol number than Ba-containing mol number, while keeping the powder or substance in non-molten condition. The effect of the reproducibility of the crystal growth of the present invention cannot be demonstrated even if the method of manufacture thereof is applied to the compact powder member or sintered member composed of only $BaTiO_3$. Although the mechanism thereof has not been confirmed as yet, it is inferred as given below. When the $BaTiO_3$—$PbTiO_3$ compact powder member or sintered member is heated, while kept in non-molten condition, lead or lead compound is evaporated from the surface of the powder or signatured substance, and externally dispersed, and the deficiency of lead ensues on the surface of the compact powder member or sintered member. Thus, lead shifts from the inside of the compact powder member or sintered member to the surface to compensate for the deficiency thereof. At this juncture, the granular interface in the inside of the compact powder member or sintered member tends to move easily, hence enabling the crystal growth to occur stably.

The $BaTiO_3$—$PbTiO_3$ series single crystal of the present invention can be manufactured at a crystal growing speed faster still by preparing the $BaTiO_3$—$PbTiO_3$ compact powder member or sintered member, which serves as starting substance, with a designated composition as described earlier or by heating it within a designated range of temperatures. The $BaTiO_3$—$PbTiO_3$ series single crystal of the present invention can be manufactured with a crystal growing speed stabilized more by coupling a designated single crystal as a seed crystal with the $BaTiO_3$—$PbTiO_3$ compact powder member or sintered member, which serves as starting substance. FIGS. 2A to 2D are views that illustrate the state of the crystal growth when the $BaTiO_3$—$PbTiO_3$ series single crystal of the present invention is manufactured, in which the designated single crystal 22 is coupled with the $BaTiO_3$—$PbTiO_3$ compact powder member or sintered member 24, and heated in non-molten condition. As shown in FIG. 2B, it is understandable that on the coupling portion of the $BaTiO_3$—$PbTiO_3$ compact powder member or sintered member with the seed crystal, particularly on the circumferential area thereof, the crystal growth occurs conspicuously. Conceivably, this is because the shift of lead occurs intensively particularly on the aforesaid circumferential area, and also, conceivably, this is the phenomenon that supports the aforesaid mechanism of crystal growth. Typically, in FIG. 2C, a reference numeral 26 designates the single-crystallized portion, and 28, the polycrystal portion.

In accordance with the present invention, it is possible to provide the $BaTiO_3$—$PbTiO_3$ series single crystal having the property comparable to the PZT material already made available as a Pb-less piezoelectric material that serves the purpose of reducing the harmful substance, such as Pb in PZT, among some others. Also, along with the increased amount of Pb-containing, the curie temperature becomes higher, but it is possible to select the curie temperature up to approximately 300° C. appropriately, thus presenting no problem as to the curie temperature. Also, the $BaTiO_3$—$PbTiO_3$ series single crystal manufactured by the sintering method has a smaller dielectric loss, and the amount of inductive distortion increases at the time of electric field application due to significant rising of electro-mechanical coupling coefficient along with the extinction of granular boundaries of the largely oblique-angled ones, hence presenting extremely favorable piezoelectric property.

Further, in accordance with the method of manufacture of the present invention, it is possible to obtain high quality $BaTiO_3$—$PbTiO_3$ series single crystal by preparing the seed crystal having bulky grain formed by sintering compact powder member, the specific composition range of which is (Ba+Pb)/Ti ratio, or by preparing the seed crystal by means of the conventional melt-solidification method, and also, producing the $BaTiO_3$—$PbTiO_3$ series sintered member, which is given the same composition adjustment, and then, by giving heat treatment subsequent to the coupling of the seed crystal and the sintered member. The growing speed of single crystal by means of this sintering method is comparable to that of the Melt-Growth method or superior thereto, and the property of this single crystal is far superior to that of the PZT sintered member currently available.

Also, it is possible to process many numbers of samples by sintering method at a time, thus not only contributing to reducing the production cost significantly, but also, making the productivity and the maintenance of property compatible so as to keep the rearrangement density in crystal in an extremely small amount, and attain the high quality thereof.

DESCRIPTION OF THE PREFERRED EMBODIMENTS

Figure 1A:
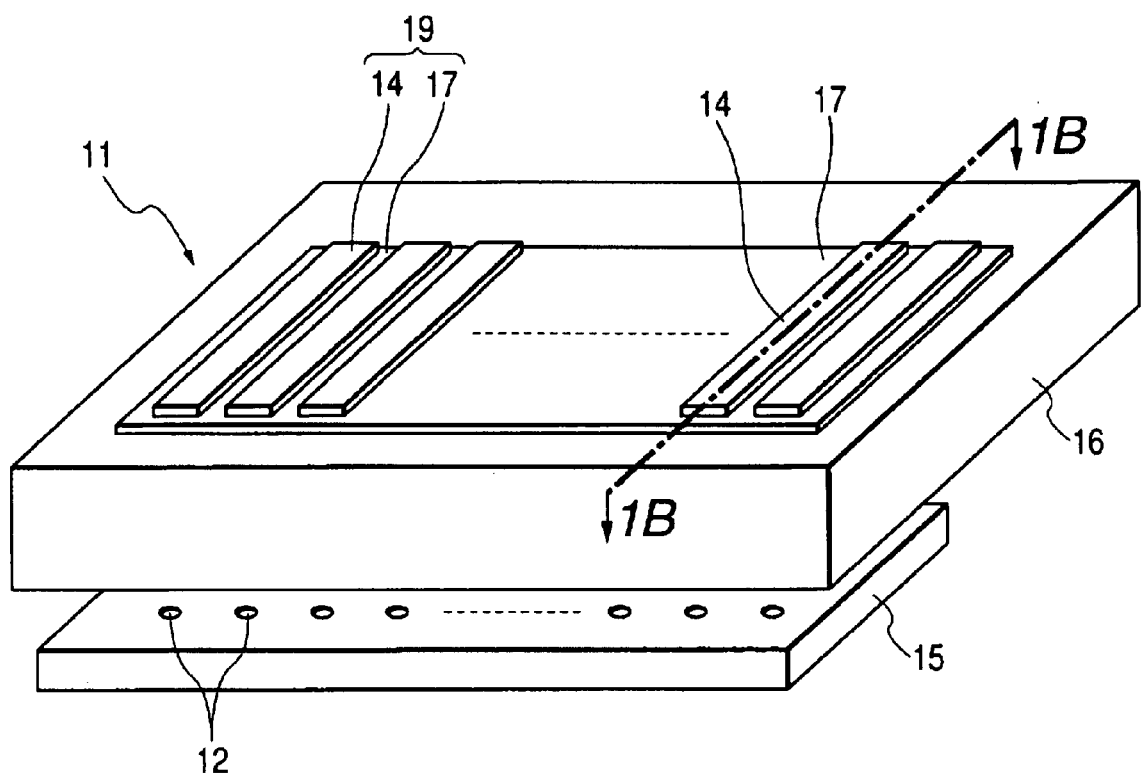
FIG. 1A is a perspective view that shows a liquid discharge head in accordance with the present invention.

The $BaTiO_3$—$PbTiO_3$ series single crystal of the present invention is such that the $BaTiO_3$—$PbTiO_3$ compact powder member or sintered member, the mol number of Pb-containing of which is smaller than that of Ba, is heated and retained in non-molten condition for the single crystallization. Further, it is preferable for the $BaTiO_3$—$PbTiO_3$ series single crystal of the present invention to monocrystallize the $BaTiO_3$—$PbTiO_3$ compact powder member or sintered member by heating and retaining in the non-molten condition, with the mol ratio of elements contained in them being arranged to be within a range of $0.9800<(Ba+Pb)/Ti<1.0000$. It is more preferable to keep the mol ratio of elements contained in the compact power or sintered member within a range of $0.9900<(Ba+Pb)/Ti<1.0000$. Still more preferably, the ratio should be kept within a range of $0.9950 \leq (Ba+Pb)/Ti \leq 0.9999$.

For the $BaTiO_3$—$PbTiO_3$ series single crystal of the present invention, it is preferable to arrange the content ratio of $PbTiO_3$ of the $BaTiO_3$—$PbTiO_3$ compact powder member or sintered member, which is the starting substance thereof, to be 45 mol % or less. When the ratio of $PbTiO_3$ content of the aforesaid compact powder member or sintered member is arranged to be 45 mol % or less, the growing speed of single crystal is promoted, while the single crystal substance is produced more stably. The resultant composition of $BaTiO_3$—$PbTiO_3$ series single crystal thus obtained is almost the same as that of the starting $BaTiO_3$—$PbTiO_3$ compact powder member or sintered member. Here, it is more preferable to arrange the amount of $PbTiO_3$ content to be 30 mol % or less or still more preferable to arrange it to be 25 mol % or less. If the amount of $PbTiO_3$ content is too much, the evaporation of lead becomes conspicuous from the $BaTiO_3$—$PbTiO_3$ compact powder member, sintered member, or single crystal. Consequently, the obtainable composition of the $BaTiO_3$—$PbTiO_3$ series single crystal is caused to change, and deviated from the target composition. Further, the obtained $BaTiO_3$ $PbTiO_3$ series single crystal becomes porous easily. In order to suppress the lead evaporation, it is imperative that a pressurized container be used, which leads to such an unfavorable problem of increased cost of manufacture. Also, the minimum amount of $PbTiO_3$ content of the $BaTiO_3$—$PbTiO_3$ compact powder member or sintered member should preferably be 0.01 mol % or more or, more preferably, 0.02 mol % or more. The $BaTiO_3$—$PbTiO_3$ series single crystal of the present invention is single-crystallized by heating the $BaTiO_3$—$PbTiO_3$ compact powder member or sintered member within a preferable temperature range of 1,200° C. or more and 1,400° C. or less. The $BaTiO_3$—$PbTiO_3$ series single crystal of the present invention may also be single-crystallized by preparing another single crystal, such as $BaTiO_3$ series single crystal or $BaTiO_3$—$PbTiO_3$ series single crystal as seed crystal, and coupling this seed with the $BaTiO_3$—$PbTiO_3$ compact powder member or sintered member, which is heated and retained. (If the crystal construction is coincident, it is preferable that a lattice constant and a thermal expansion coefficient of the polycrystal member and seed crystal is within ±15%.) When using such seed crystal, it becomes possible to match the crystal orientation of the $BaTiO_3$—$PbTiO_3$ series single crystal with that of the seed crystal. Further, the $BaTiO_3$—$PbTiO_3$ series single crystal of the present invention is composed of the crystalline particles, the average granular diameter of which is 20 μm or less, with the $BaTiO_3$ series single crystal or $BaTiO_3$—$PbTiO_3$ series single crystal as seed crystal, and may be single-crystallized by coupling the $BaTiO_3$—$PbTiO_3$ series sintered member having a relative density of 95% or more with the {100}, {110}, or {111} surface of the aforesaid seed crystal, which is heated and retained in non-molten condition. Here, the $BaTiO_3$ series single crystal or $BaTiO_3$—$PbTiO_3$ series single crystal used as the seed crystal is manufactured by the method for manufacturing the $BaTiO_3$—$PbTiO_3$ series single crystal of the present invention or may be manufactured either by the general sintering method or by the flux or TSSG method. Here, although the reasons are not clear, it is possible to manufacture excellent $BaTiO_3$—PbTiO3 series single crystal in a better quality when using the single crystal that has been manufactured by the method of the present invention for manufacturing $BaTiO_3$—$PbTiO_3$ series single crystal as the seed crystal than the single crystal manufactured by the flux or TSSG method. The method of the present invention for manufacturing $BaTiO_3$—$PbTiO_3$ series single crystal includes a process in which $BaTiO_3$—$PbTiO_3$ compact powder member or sintered member is single-crystallized by heating it preferably in the lead atmosphere, and retained in non-molten condition. As a method for forming the lead atmosphere, a lead-contained compound, such as PZT or $PbTiO_3$, is arranged to be coexistent in the environment where the $BaTiO_3$—$PbTiO_3$ compact powder member or sintered member is heated, and then, lead or lead oxide is evaporated from the aforesaid lead-contained compound. In this way, the composition changes of the $BaTiO_3$—$PbTiO_3$ series single crystal in the growing process (particularly, the lead evaporation from the $BaTiO_3$—$PbTiO_3$ series single crystal) can be suppressed, thus making it possible to increase the crystallization speed more.

However, when manufacturing the $BaTiO_3$—$PbTiO_3$ series single crystal the ratio of $PbTiO_3$ content of which exceeds 30 mol %, the lead evaporation becomes particularly conspicuous to make it easier to change the composition from the target one. Further, the ratio of pore content of the obtained single crystal tends to become higher. In order to suppress the lead evaporation, there are often the cases where only the execution of the heating process under the lead atmosphere as described earlier is not good enough. For example, it is preferable to execute the heating process in a pressurized container under a pressure of more than one atmosphere. There is a need for a comparatively long period of heating process (10 hours or more) when a single crystal synthesis is executed by the sintering method using such a pressurized container as HIP. As compared with the process under the normal pressure, this is unfavorable in terms of the productivity and costs. For the $BaTiO_3$—$PbTiO_3$ series single crystal of the present invention, it is desirable to provide the rearrangement density of $10^2$ pieces/cm$^2$ or more and $10^6$ pieces/cm$^2$ or less, and the ratio of pore content of 1 volume ppm or more and 5 volume % or less. In this way, the single crystal of the present invention presents a small dielectric loss, and a large electromechanical coupling coefficient. For example, the dielectric loss is 1% or less, and the electro-mechanical coupling coefficient exceeds 85%.

Also, it is desirable for the $BaTiO_3$—$PbTiO_3$ series single crystal of the present invention to provide a volume of 1 mm$^3$ or more. With the volume of 1 mm$^3$ or more, the crystal can be utilized for the various sizes of many kinds of devices with the provision of a large area thereof, among some other means. Also, for the method of manufacture of the present invention, the material powder used for manufacturing the BaTiO$_3$—PbTiO$_3$ compact powder member or sintered member is not particularly limited, and the following may be usable. In a case of using the solid-phase reaction, the following can be used:

1) BaTiO$_3$ powder is produced by preliminarily sintering a mixture of BaO (obtainable by thermal decomposition from BaCO$_3$ or barium oxalate) and TiO$_2$, and PbTiO$_3$ powder is produced by preliminarily sintering a mixture of PbO and TiO$_2$; and further, 2) The BaTiO$_3$—PbTiO$_3$ powder or the like, which is directly produced from BaO, PbO, and TiO$_2$ powder.

Also, it is possible to use the mixture of BaTiO$_3$ and PbTiO$_3$, which is obtainable by the wet or hydro-thermal method, such as coprecipitation or oxalic acid method, and also, BaTiO$_3$—PbTiO$_3$ powder or the like, which is obtainable by the wet, hydrothermal method, such as coprecipitation or oxalic acid method, among some others. For the material powder, it is desirable to keep the average granular diameter of the primary grain to be within a range of 0.055 μm. Also, as described earlier, it is preferable to adjust the material powder so that the mol ratio of the elements contained in the BaTiO$_3$—PbTiO$_3$ compact powder member or sintered member, which is obtained from such material power to become the starting substance, should be 0.9800<(Ba+Pb)/Ti<1.0000. Also, more preferably, the material powder is adjusted so that the mol ratio of the elements contained in the BaTiO$_3$—PbTiO$_3$ compact powder member or sintered member should be 0.9900<(Ba+Pb)/Ti<1.0000. Still more preferably, it should be 0.9950≦(Ba+Pb)/Ti≦0.9999. The composition-adjusted powder is made to be the compact powder member after the general formation by means of a uniaxial press or a cold press using hydrostatic pressure. The compact powder member thus obtained may be made a sintered member by sintering under the normal condition. The compact powder member or sintered member is heated in the non-molten condition to obtain the bulky crystal grain of the BaTiO$_3$—PbTiO$_3$ series single crystal having the average granular diameter of 1 mm or more. The heating in the non-molten condition is given more preferably within a temperature range of 1,200° C. or more and 1,400° C. or less. Further, using the single crystal thus obtained by the aforesaid method as seed crystal it may become comparatively easy to make large BaTiO$_3$—PbTiO$_3$ series single crystal.

As described above, in order to make larger BaTiO$_3$—PbTiO$_3$ series single crystal with ease, it is preferable to use some other single crystal as seed crystal. The seed crystal and the starting BaTiO$_3$—PbTiO$_3$ compact powder member or sintered member are coupled, which is heated and retained for crystallization. As a preferred seed crystal, BaTiO$_3$ series single crystal or BaTiO$_3$—PbTiO$_3$ series single crystal is usable here. As a preferred method for preparing the seed crystal, the method of the present invention for manufacturing BaTiO$_3$—PbTiO$_3$ series single crystal, a general sintering method, or a melt solidification method, such as TSSG or flux method, is applicable here. Particularly, it is preferable to use the single crystal prepared by the method of the present invention for manufacturing BaTiO$_3$—PbTiO$_3$ series single crystal as the seed crystal, because the crystalline defect can be suppressed more for the BaTiO$_3$—PbTiO$_3$ series single crystal thus obtained. The {100}, {110}, or {111} surface is cut out and polished to be the coupling surface of the seed crystal.

Also, when the single crystallization is executed using the seed crystal, the mol ratio of the elements contained in the BaTiO$_3$—PbTiO$_3$ series sintered member to be single-crystallized should preferably be adjusted to be 0.9800<(Ba+Pb)/Ti<1.0000. More preferably, the mol ratio should be adjusted to be 0.9900<(Ba+Pb)/Ti<1.0000. Still more preferably, it should become 0.9950≦(Ba+Pb)/Ti≦0.9999. Further, the sintered member is sintered so that the average granular diameter of the crystalline grain should be 20 μm or less, and the relative density should be 95% or more. The sintering method is not particularly limited, and the normally pressurized sintering, the hot press, the HIP (hot isostatic press), or the like is applicable here. In this respect, if the ratio of pore content of the sintered member exceed 5 volume %, the ratio of pore content in the single crystal obtained by the crystal growth is also increased, which unfavorably lowers the mechanical strength thereof. With the composition having a large amount of lead in particular, the ratio of pore content tends to become greater due to the lead evaporation during the growth of single crystal. In this case, therefore, it is preferable to keep the ratio of pore content in the sintered member to be less than 5 volume %. It is also preferable to precisely polish the coupling surface of the sintered member and seed crystal to be the surface roughness Ra=1.0 nm or less, and the flatness λ(λ=633 nm) or less, respectively. The polished surfaces of the sintered member and seed crystal may be in contact directly or may be in contact after coating the organic or inorganic acid that contains Ba, Pb, Ti component. The seed crystal and sintered member, the polished surfaces of which are in contact with each other, should preferably be coupled by heating for a specific time with self-weight or a load of approximately 9.8 MPa or less. Further, it is more preferable to execute the coupling in the lead atmosphere in order to suppress the lead evaporation from near the surface of the sample in the coupling process.

For the purpose of promotion of crystal growth, a fine quantity of additives which is not replaceable or very difficult to be replaced with A and B sites is added to the BaTiO$_3$—PbTiO$_3$ series single crystal of the present invention, the A site or B site of perovskite ABO$_3$ structure is replaced with some other element, or a third component of other perovskite structure may be given solid solution for the purpose of site exchange. The quantity thereof is not particularly limited, but preferably, it is 10 weight percent or less for the fine amount of additives; 10 mol percent or less for each cyto as the element to be replaced with the A cyto or B cyto; or 10 mol percent or less for all the components as the third component to be given solid solution. The kind of the component is not particularly limited, but preferably, it is such element (ion) as Na, K, Ca, Cr, Co, Bi, Sr, La, Zr, Sn, Mg, Mn, Zn, Nb, Ta, Ni or the oxide or compound oxide that contains these elements. An extreme part of impurity components for promoting crystal growth resides in the single crystal as impurities in association with movement of the crystal growth border. However, there is no practical problem since most of the components move to a distal end of the grown crystal.

Now, the element analysis of Ba, Pb, Ti, or the like for the compact powder member, sintered member, or single crystal can be made by use of an analyzer dedicated therefor in accordance with the analytical method, such as fluorescent X-ray analysis, ICP (emission plasma) analysis, or ICP-MASS (emission plasma-mass) analysis, among some others. Also, the crystallinity and orientation of single crystal can be confirmed by means of such method as etch-pit image observation, the in-plane measurement and out-of-plane measurement of X-ray diffraction, or electron diffraction measurement, among some others, which are used for the measurement of rearrangement density to be described later.

Regarding the ratio of pore content in the sintered member and the grown single crystal, the porous amount (porous area) exposed on the surface of a sample after the mirror surface polishing is measured by use of a reflection microscope, SEM (scanning electron microscope), or the like if the value thereof is approximately 0.1 volume % or more, and then, the ratio of pore content is worked out by the ratio of such amount to the measured area. Also, if the value is approximately less than 0.1 volume %, this method is not good enough in terms of precision. Therefore, a thin piece of approximately several tens $\mu$m thick is prepared, and the size of pore and the number thereof, which exist in the observable sight of a transmission microscope, are measured, and the ratio of pore content is worked out by the ratio thereof to the observed volume.

Also, the rearrangement in single crystal can be observed using a microscope or the like as etch pit (=rearrangement) by corroding the crystalline surface of the single crystal with HCl—HF solution or the like. In detail, the number of rearrangement (etch pit) generated in several hundreds to thousand $\mu m^2$ is counted and the counted number is changed to per 1 $cm^2$ in order to determine the rearrangement density.

Hereinafter, the present invention will be described further in detail in accordance with the specific embodiments. It is to be understood, however, the present invention is not limited to such embodiments.

(First Embodiment)

$TiO_2$ (26.7557 g), PbO (0.7440 g), and $BaCO_3$ (65.1209 g) are wet blended, and after dried, tentatively burned at 1,100° C. for five hours, and, while being crushed, formed into a disk (of 16 mm diameter). For the compact powder member thus formed, the mol ratio of contained elements is (Ba+Pb)/Ti=0.9950. This powder is sintered at 1,360° C. for 10 hours to obtain the sintered member. The sintered member thus obtained is composed of bulky crystal grain of average granular diameter of approximately 2.0 mm. The composition of the sintered member is: $BaTiO_3$ of 99.0 mol %-$PbTiO_3$ of 1.0 mol %. From this sintered member, the bulky crystal grain is drawn out as seed crystal, and the (100) plane of the crystal grain is cut out and finished with the surface roughness Ra=0.2 nm and the flatness $\lambda$/2. On the other hand, the same compound is formed into a disc of 10 mm diameter×15 mm thick, and sintered at 1,280° C. for three hours to obtain the sintered member of $BaTiO_3$ of 99.0 mol %-$PbTiO_3$ of 1.0 mol % in the relative density of 97.3%. The average granular diameter of the crystal grain that constitutes this sintered member is approximately 10 $\mu$m. The composition thereof is (Ba+Pb)/Ti=0.9950. The end face of this sintered member is likewise mirror finished to be the surface roughness Ra=0.2 nm and the flatness $\mu$/2. The polished surfaces of both seed crystal and sintered member are rinsed using acetone for mechanical coupling, and retained in the oxygen atmosphere at 1,360° C. for 40 hours, while keeping this state in the non-molten condition, for the execution of single crystallization. In the process of the single crystal growth, a magnesia crucible is covered over the sample to suppress the Pb evaporation. After the growing process, the single crystallization takes place from the surface coupled with the single crystal to approximately 12 mm.

From this result, it has been found that the growing speed is 0.3 mm/h, and that the growth is possible at a speed much faster than the growing speed of the conventional melt solidification method. Also, the ratio of pore content is 0.9 volume % in the single crystal of $BaTiO_3$ of 99.0 mol %-$PbTiO_3$ of 1.0 mol %, which is obtained by the sintering method using the seed crystal, and the rearrangement density is found to be $1\times10^3/cm^2$ when examined by etching it in the HCl—HF solution.

(Second Embodiment)

$TiO_2$ (26.64868 g), PbO (5.2080 g), and $BaCO_3$ (61.1742 g) are wet blended, and after dried, tentatively burned at 1,150° C. for five hours, and, while being crushed, formed into a disc (of 20 mm diameter). For the compact powder member thus formed, the mol ratio of contained elements is (Ba+Pb)/Ti=0.9990. This powder is sintered at 1,350° C. for 10 hours to obtain the sintered member. The sintered member thus obtained is composed of bulky crystal grain of average granular diameter of approximately 3.0 mm. The composition of the sintered member is: $BaTiO_3$ of 93.0 mol %-$PbTiO_3$ of 7.0 mol %. From this sintered member, the bulky crystal grain is drawn out as seed crystal, and the (110) plane of the crystal grain is cut out and finished with the surface roughness Ra=0.3 nm and the flatness $\lambda$/4. On the other hand, the same compound is formed into a disc of 10 mm diameter×20 mm thick, and sintered at 1,250° C. for three hours to obtain the sintered member of $BaTiO_3$ of 93.0 mol %-$PbTiO_3$ of 7.0 mol % in the relative density of 99.1%. The average granular diameter of the crystal grain that constitutes this sintered member is approximately 8 $\mu$m. The composition thereof is (Ba+Pb)/Ti=0.9990. The end face of this sintered member is likewise mirror finished to be the surface roughness Ra=0.2 nm and the flatness $\lambda$/2. The polished surfaces of both seed crystal and sintered member are rinsed using acetone for coupling by coating a mixed solution of $BaCl_3$ and $TiOCl_2$ (mixing ratio thereof=1:0.5) on the coupling interface, and retained in the oxygen atmosphere at 1,370° C. for 50 hours, while keeping this state in the non-molten condition, for the execution of single crystallization. After the growing process, the single crystallization takes place from the surface coupled with the seed crystal to approximately 18 mm.

From this result, it has been found that the growing speed is 0.36 mm/h, and that the growth is possible at a speed much faster than the growing speed of the conventional melt solidification method. Also, the ratio of pore content is 0.8 volume % in the single crystal of $BaTiO_3$ of 93.0 mol %-$PbTiO_3$ of 7.0 mol %, which is obtained by the sintering method using the seed crystal, and the rearrangement density is found to be $5\times10^2/cm^2$ when examined by etching it in the HCl—HF solution.

(Third Embodiment)

The $BaTiO_3$ series single crystal, which is manufactured by the TSSG method and made available on the market, is cut 5×5×0.5 mm on the orientation plane (100), and this plane is polished to be the surface roughness Ra=0.4 nm and the flatness $\lambda$/6. On the other hand, the $BaTiO_3$ (Ba/Ti=0.9996) powder, which is manufactured by the hydrothermal method, and the $PbTiO_3$ (Pb/Ti=1.0000) powder, which is manufactured by the solid-phase method, are blended in the ratio of 99.8 mol: 0.2 mol. While being crushed by means of pot mill, this powder is formed into a disc (of 16 mm diameter), and sintered at 1,280° C. for three hours to produce the sintered member having relative density of 98.9%. The mol percent of the elements contained in the sintered member thus obtained, with $BaTiO_3$ of 99.8 mol %-$PbTiO_3$ of 0.2 mol %, is (Ba+Pb)/Ti=0.9996, and the average granular diameter of the crystal grain that constitutes this sintered member, having $BaTiO_3$ of 99.8 mol %-$PbTiO_3$ of 0.2 mol %, is approximately 12 $\mu$m. The end face of this sintered member is mirror finished to be the surface roughness Ra=0.4 nm and the flatness $\lambda$/6. The polished surfaces of both seed crystal and sintered member are rinsed using acetone for mechanical coupling, and retained in the oxygen atmosphere at 1,380° C. for 30 hours, while keeping this state in the non-molten condition, for the execution of single crystallization. After the growing process, the single crystallization takes place from the surface coupled with the seed crystal to approximately 11 mm.

From this result, it has been found that the growing speed is 0.37 mm/h, and that the growth is possible at a speed much faster than the growing speed of the conventional melt solidification method. Also, the ratio of pore content is 0.7 volume % in the single crystal of $BaTiO_3$ of 99.8 mol %-$PbTiO_3$ of 0.2 mol %, which is obtained by the sintering method using the seed crystal, and the rearrangement density is found to be $5\times10^3/cm^2$ when examined by etching it in the HCl—HF solution.

(Fourth Embodiment)

Single crystal growth is executed by the sintering method in the same condition as that of the second embodiment. However, for the present embodiment, an electric furnace having an effective volume of 150×150×150 mm, which is provided with molybdenum silicide heat generating member, is used. Then, 30 samples and 6 PZT sintered elements of 20 mm diameter each are inserted into the furnace for growing in the atmosphere of 100% oxygen. After this process, all of the samples are single-crystallized up to almost 18 mm in length. The production speed is roughly estimated to be 108 $cm^3$/furnace, because 30 samples of 16 mm diameter×18 mm long each (volume, 3.6 $cm^3$) are produced. The time required for the growth is 50 hours, which is 2.16 $cm^3$ per hour. Therefore, the productivity is extremely high.

(Fifth Embodiment)

The $BaTiO_3$ (Ba/Ti=0.9973) powder, which is obtained by the solid-phase method with 5-hour provisional burning at 1,150° C. and crushing, and the $PbTiO_3$ (Pb/Ti=1.0000) powder, which is prepared by wet method, are blended in a ratio of 75.0 mol and 25.0 mol, and formed into a disc (of 30 mm diameter). The mol ratio of elements contained in the compact power thus formed is (Ba+Pb)/Ti=0.9998. This compact powder member is sintered at 1,320° C. for 50 hours to obtain the sintered member. The sintered member is composed of bulky crystal grain of approximately 1.10 mm diameter, and the composition of the sintered member is $BaTiO_3$ of 75.0 mol %-$PbTiO_3$ of 25.0 mol %. From this sintered member, the bulky crystal grain (single crystal) of $BaTiO_3$ of 75.0 mol %-$PbTiO_3$ of 25.0 mol % is drawn out.

The ratio of pore content is 3.2 volume % in the single crystal of the $BaTiO_3$ of 75.0 mol %-$PbTiO_3$ of 25.0 mol %. Also, the rearrangement density thereof is examined by etching it in the HCl—HF solution, with the result of $1\times10^2/cm^2$, thus making the crystal defect small.

(Sixth Embodiment)

The $BaTiO_3$ (Ba/Ti=0.9973) powder and the $PbTiO_3$ (Pb/Ti=1.0000) powder, which are prepared by the same method as the fifth embodiment, are blended by wet method in a ratio of 75.0 mol and 25.0 mol, and formed into a disc (of 20 mm diameter). The mol ratio of elements contained in the compact power thus formed is (Ba+Pb)/Ti=0.9998. This compact powder member is sintered at 1,190° C. for five hours to obtain the sintered member. The composition of this sintered member is $BaTiO_3$ of 75.0 mol %-$PbTiO_3$ of 25.0 mol %, and the relative density is 97.8%. This sintered member is composed of crystal grain the average granular diameter of which is approximately 10 $\mu$m. End face of this sintered member is processed to be the surface roughness Ra=0.2 nm, and the flatness λ/6. Then, the end face (100) of the $BaTiO_3$ series single crystal, which is prepared by the melt solidification method for use of seed crystal, is processed in the same precision. Both polished faces of the sintered member and seed crystal are in contact and coupled at 1,200° C. for 1 hour under a pressure of 9.8 MPa. With the sample thus coupled, the sintered member of $BaTiO_3$ of 30.0 mol %-$PbTiO_3$ of 70.0 mol % is placed on a setter. With an MgO crucible being covered, the lead atmosphere is formed, and the single crystallization is executed at 1,280° C. for 30 hours. After the growing process, the single crystallization is effectuated from the surface coupled with the seed crystal to approximately 14 mm.

From this result, it has been found that the growing speed is 0.47 mm/h, and that the growth is possible at a speed much faster than the growing speed of the conventional melt solidification method. Also, the ratio of pore content is 2.1 volume % in the single crystal of $BaTiO_3$ of 75.0 mol %-$PbTiO_3$ of 25.0 mol %, which is obtained by the sintering method, and the rearrangement density is found to be $5\times10^2/cm^2$ when examined by etching it in the HCl—HF solution, thus making crystal defect small.

(Seventh Embodiment)

$TiO_2$ (26.6753 g), PbO (5.2080 g), and $BaCO_3$ (61.1742 g) are wet blended, and after dried, tentatively burned at 1,150° C. for five hours, and, while being crushed, formed into a disc (of 20 mm diameter). For the compact powder member thus formed, the mol ratio of contained elements is (Ba+Pb)/Ti=0.9980. This powder is sintered at 1,350° C. for 10 hours to obtain the sintered member. The sintered member thus obtained is composed of bulky crystal grain of average granular diameter of approximately 3.0 mm. The composition of the sintered member is $BaTiO_3$ of 93.0 mol %-$PbTiO_3$ of 7.0 mol %. From this sintered member, the bulky crystal grain is drawn out as seed crystal, and the (110) plane of the crystal grain is cut out and finished with the surface roughness Ra=0.3 nm and the flatness λ/4. On the other hand, the same compound is formed into a disc of 10 mm diameter×20 mm thick, and sintered at 1,250° C. for three hours to obtain the sintered member of $BaTiO_3$ of 93.0 mol %-$PbTiO_3$ of 7.0 mol % in the relative density of 99.1%. The average granular diameter of the crystal grain that constitutes this sintered member is approximately 7 $\mu$m. The composition thereof is (Ba+Pb)/Ti=0.9980. The end face of this sintered member is mirror finished to be the surface roughness Ra=0.2 nm and the flatness λ/2. The polished surfaces of both seed crystal and sintered member are rinsed using acetone for coupling by coating a mixed solution of $BaCl_3$ and $TiOCl_2$ (mixing ratio thereof=1:0.5) on the coupling interface. Each one of sample and PZT sintered member are placed on a setter, and further, covered with an MgO crucible to form the atmosphere that contains Pb. While maintaining this state, these are retained at 1,370° C. for 20 hours in the non-molten condition for the execution of single crystallization. After the growing process, the single crystallization takes place from the surface coupled with the single crystal to approximately 18 mm.

From this result, it has been found that the growing speed is 0.90 mm/h, and that the growth is possible at a speed faster than the growing speed indicated in the second embodiment. Also, the Pb density of the surface layer of the sample of the single crystal of $BaTiO_3$ of 93.0 mol %-$PbTiO_3$ of 7.0 mol %, which is obtained by the sintering method, has almost no difference with the Pb density in the central portion, and it has been found that the sample is composed uniformly as a whole. The ratio of pore content is 0.4 volume % in the single crystal of $BaTiO_3$ of 93.0 mol %-$PbTiO_3$ of 7.0 mol %, using the seed crystal, and the rearrangement density is found to be $5\times10^2/cm^2$ when examined by etching it in the HCl—HF solution.

(Eighth Embodiment)

The BaTiO$_3$ series single crystal, which is manufactured by the TSSG method and made available on the market as in the case of the third embodiment, is cut 5×5×0.5 mm on the orientation plane (111), and this plane is polished to be the surface roughness Ra=0.3 nm and the flatness λ/4 to make it seed crystal. On the other hand, the BaTiO$_3$ (Ba/Ti=0.9993) powder, which is manufactured by the oxalate method, and the PbTiO$_3$ (Pb/Ti=0.9960) powder, which is prepared by the solid-phase method are blended in the ratio of 93.2 mol: 6.8 mol. While being crushed by means of pot mill, this powder is formed into a disc (of 16 mm diameter), and sintered by means of hot press at 1,200° C. for 1 hour to produce the sintered member having relative density of 99.4%. The composition of the sintered member thus obtained is BaTiO$_3$ of 93.2 mol %-PbTiO$_3$ 6.8 mol %. The mol percent of the elements contained in the sintered member is (Ba+Pb)/Ti=0.9991. The sintered member is composed of the crystal grain the average granular diameter of which is approximately 2 μm. The end face of this sintered member is mirror finished to be the surface roughness Ra=0.3 nm and the flatness λ/4. The polished surfaces of both seed crystal and sintered member are rinsed using acetone for mechanical coupling. Each one of PZT sintered member coupled with the sample is placed on a setter, and further, covered by an MgO crucible to form the atmosphere that contains Pb, and then, retained in the oxygen atmosphere at 1,370° C. for 20 hours, while keeping this state in the non-molten condition, for the execution of single crystallization. After the growing process, the single crystallization takes place from the surface coupled with the seed crystal to approximately 14 mm.

From this result, it has been found that the growing speed is 0.70 mm/h, and that the growth is possible at a speed much faster than the growing speed of the conventional melt solidification method. Also, the ratio of pore content is 0.2 volume % in the single crystal of BaTiO$_3$ of 93.2 mol %-PbTiO$_3$ of 6.8 mol %, which is obtained by the sintering method using the seed crystal, and the rearrangement density is found to be $1 \times 10^3 / cm^2$ when examined by etching it in the HCl—HF solution.

(Ninth Embodiment)

The BaTiO$_3$ series single crystal, which is manufactured by the TSSG method and made available on the market as in the third embodiment, is cut 5×5×0.5 mm on the orientation plane (100), and this plane is polished to be the surface roughness Ra=0.3 nm and the flatness λ/4 to make it seed crystal. On the other hand, the BaTiO$_3$ (Ba/Ti=0.9990) powder, which is manufactured by the oxalate method, and the PbTiO$_3$ (Pb/Ti=0.9980) powder, which is manufactured by the solid-phase method, are blended in the ratio of 90.7 mol: 9.3 mol. While being crushed by means of pot mill, this powder is formed into a disc (of 16 mm diameter), and sintered at 1,200° C. for 1 hour O$^2$—HIP (atmosphere: 20% O$^2$ and pressure: 98 MPa) to produce the sintered member of BaTiO$_3$ of 90.7 mol %-PbTiO$_3$ of 9.3 mol %, the relative density of which is 99.96%. The sintered member thus obtained is composed of crystal grain of average diameter of approximately 1 μm. The mol ratio of elements contained in this sintered member is (Ba+Pb)/Ti=0.9989. The end face of this sintered member is mirror finished to be the surface roughness Ra=0.3 nm and the flatness μ/4. The polished surfaces of both seed crystal and sintered member are rinsed using acetone for mechanical coupling. Each one of PZT sintered member coupled with the sample is placed on a setter, and further, covered by an MgO crucible to form the atmosphere that contains Pb, and then, retained in the oxygen atmosphere at 1,370° C. for 19 hours, while keeping this state in the non-molten condition, for the execution of single crystallization. After the growing process, the single crystallization takes place from the surface coupled with the seed crystal to approximately 18 mm.

From this result, it has been found that the growing speed is 0.95 mm/h, and that the growth is possible at a speed much faster than the growing speed of the conventional melt solidification method. Also, the ratio of pore content is 0.0003 volume % in BaTiO$_3$—PbTiO$_3$ series single crystal, which is obtained by the sintering method using the seed crystal, and the rearrangement density is found to be $1 \times 10^3 / cm^2$ when examined by etching it in the HCl—HF solution.

(Tenth Embodiment)

The BaTiO$_3$ series single crystal, which is manufactured by the TSSG method and made available on the market as in the third embodiment, is cut 5×5×0.5 mm on the orientation plane (100), and this plane is polished to be the surface roughness Ra=0.3 nm and the flatness λ/4 to make it seed crystal. On the other hand, the BaTiO$_3$ (Ba/Ti=0.9945) powder, which is manufactured by the oxalate method, and the PbTiO$_3$ (Pb/Ti=0.9952) powder, which is manufactured by the solid-phase method, are blended in the ratio of 55.0 mol: 45.0 mol. While being crushed by means of pot mill, this powder is formed into a disc (of 16 mm diameter), and sintered at 1,200° C. for 1 hour O$^2$—HIP (atmosphere: 20% O$^2$ and pressure: 98 MPa) to produce the sintered member of BaTiO$_3$ of 55.0 mol %-PbTiO$_3$ of 45.0 mol %, the relative density of which is 99.96%. The sintered member thus obtained is composed of crystal grain of average diameter of approximately 4 μm. The mol ratio of elements contained in this sintered member is (Ba+Pb)/Ti=0.9948. The end face of this sintered member is mirror finished to be the surface roughness Ra=0.3 nm and the flatness λ/4. The polished surfaces of both seed crystal and sintered member are rinsed using acetone for mechanical coupling. Each one of PZT sintered member coupled with the sample is placed on a setter, and further, covered by an MgO crucible to form the atmosphere that contains Pb, and then, retained in the oxygen atmosphere at 1,360° C. for 20 hours, while keeping this state in the non-molten condition, for the execution of single crystallization. After the growing process, the single crystallization takes place from the surface coupled with the seed crystal to approximately 13 mm. However, the ratio of pore content in the single crystal thus formed is 8.9 volume %, which is in a condition of being too porous to be utilizable.

Based upon this result, the growing atmosphere is arranged with 20% O$^2$–80% Ar composition under 50 atmospheric pressure, and the aforesaid coupled sample of seed crystal-sintered member is retained at 1,350° C. for twenty-four hours for the heat treatment in the non-molten condition. The sample, which has been processed under pressure, is single-crystallized from the surface coupled with the seed crystal to approximately 15 mm, and the growing speed is 0.63 mm/h. Thus, it has been found that the growth is possible at a speed much faster than the growing speed of the conventional melt solidification method. Also, the ratio of pore content is reduced to 5.1 volume % in the single crystal of BaTiO$_3$ of 55.0 mol %-PbTiO$_3$ of 45.0 mol %, which is obtained by the sintering method using the seed crystal, and the rearrangement density is also found to be $1 \times 10^4 / cm^2$ when examined by etching it in the HCl—HF solution.

(Eleventh Embodiment)

Figure 5:
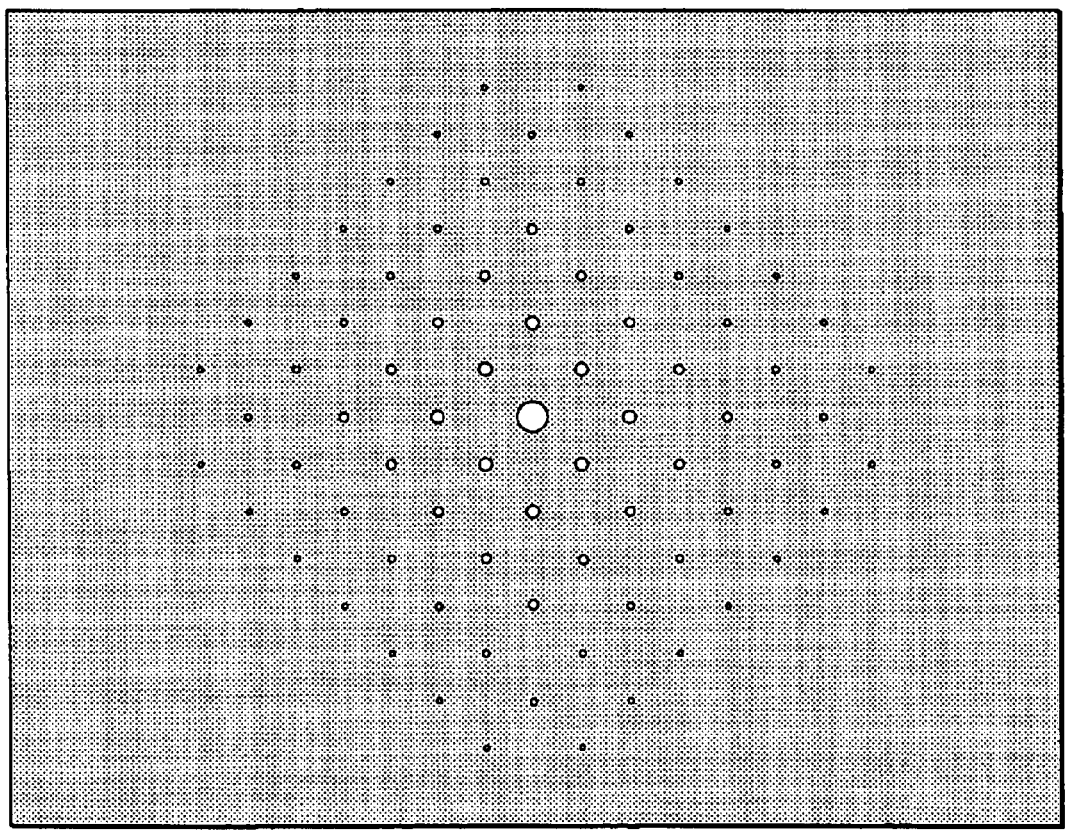
FIG. 5 is a view that shows the electron diffraction pattern of the $BaTiO_3$—$PbTiO_3$ series single crystal of the present invention after single crystallization using seed crystals in accordance with the eleventh embodiment.

TiO$_2$ (26.7288 g), PbO (0.3720 g), and BaCO$_3$ (65.4498 g) are wet blended, and after dried, tentatively burned at 1,100° C. for five hours, and, while being crushed, formed into a disc (of 20 mm diameter). For the compact powder member thus formed, the mol ratio of contained elements is (Ba+Pb)/Ti=0.9960. This powder is sintered at 1,330° C. for 10 hours to obtain the sintered member. The sintered member thus obtained is composed of bulky crystal grain of average granular diameter of approximately 2.6 mm. The composition of the sintered member is $BaTiO_3$ of 99.5 mol %-$PbTiO_3$ of 0.5 mol %. From this sintered member, the bulky crystal grain is drawn out as seed crystal, and the (001) plane of the crystal grain is cut out and finished with the surface roughness Ra=0.2 nm and the flatness λ/2. The electron beam diffraction image of this bulky crystal grain is measured. It is then confirmed that the single crystal has the crystalline orientation of extremely uniform. FIG. 5 shows this electron beam diffraction image. On the other hand, the same compound is formed into a disc of 10 mm diameter×20 mm thick, and sintered at 1,250° C. for three hours to obtain the sintered member of $BaTiO_3$ of 99.5 mol %-$PbTiO_3$ of 0.5 mol % in the relative density of 96.8%. The average granular diameter of the crystal grain that constitutes this sintered member is approximately 6 μm. The mol ratio of elements contained in this sintered member is (Ba+Pb)/Ti=0.9960. The end face of this sintered member is likewise mirror finished to be the surface roughness Ra 0.2 nm and the flatness λ/2. The polished surfaces of both seed crystal and sintered member are rinsed using acetone for coupling by coating a mixed solution of $BaCl_3$ and $TiOCl_2$ (mixing ratio thereof=1:0.5) on the coupling interface, and retained in the oxygen atmosphere at 1,300° C. for 30 hours, while keeping this state in the non-molten condition, for the execution of single crystallization. After the growing process, the single crystallization takes place from the surface coupled with the seed crystal to approximately 14 mm.

Figure 3:
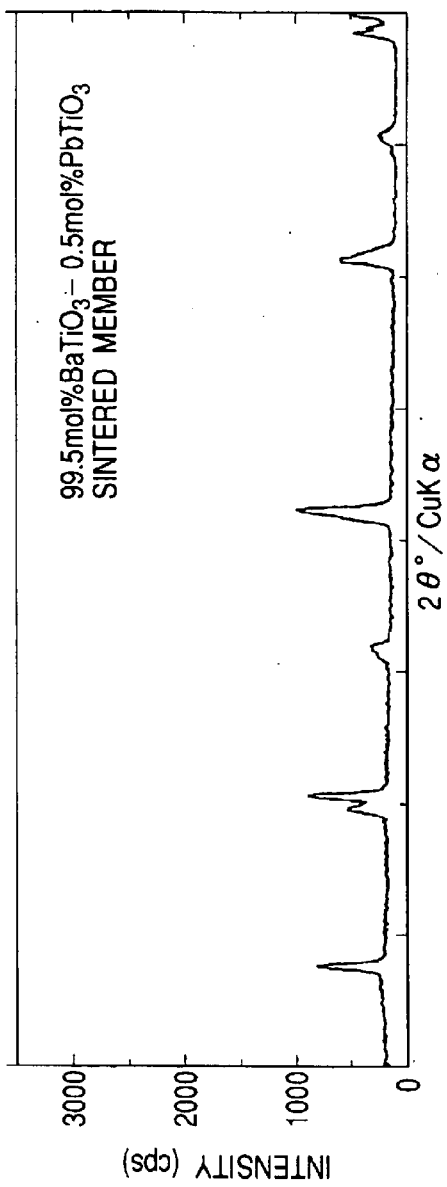
FIG. 3 is a view that shows the X-ray diffraction pattern of the $BaTiO_3$—$PbTiO_3$ series single crystal of the present invention after single crystallization by coupling seed crystals in accordance with an eleventh embodiment.
Figure 4:
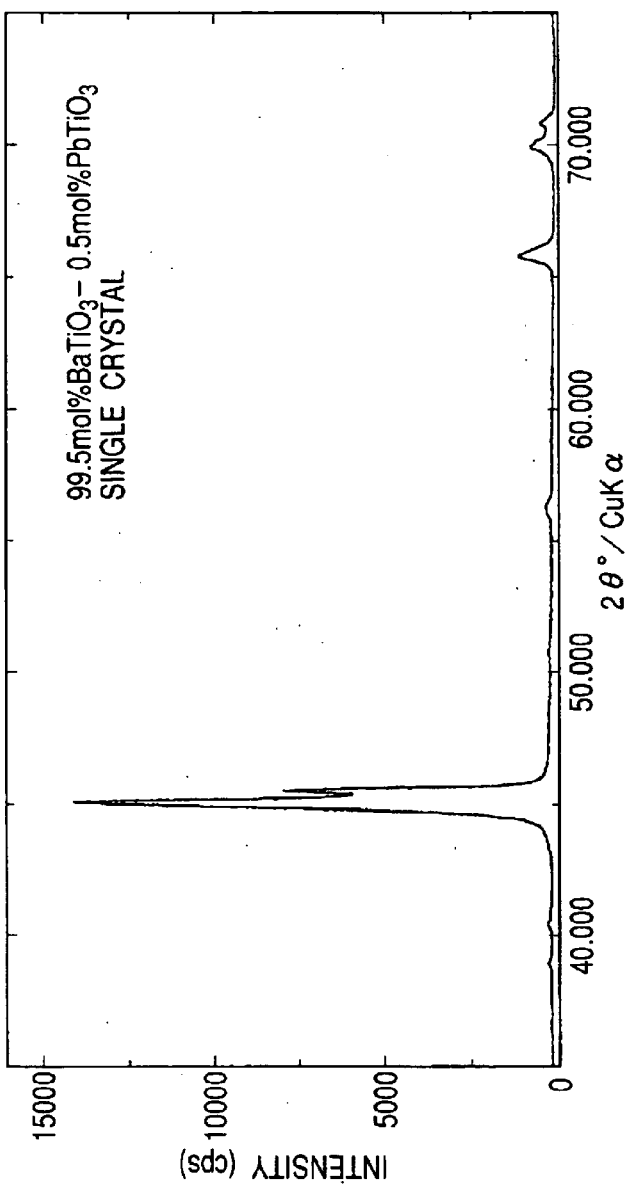
FIG. 4 is a view that shows the X-ray diffraction pattern of the $BaTiO_3$—$PbTiO_3$ series single crystal of the present invention after single crystallization by coupling seed crystals in accordance with the eleventh embodiment.

From this result, it has been found that the growing speed is 0.47 mm/h, and that the growth is possible at a speed much faster than the growing speed of the conventional melt solidification method. Also, the ratio of pore content is 0.8 volume % in the single crystal of $BaTiO_3$ of 99.5 mol %-$PbTiO_3$ of 0.5 mol %, which is obtained by the sintering method using the seed crystal, and the rearrangement density is found to be $2 \times 10^2/cm^2$ when examined by etching it in the HCl—HF solution. FIG. 3 shows the result of measurement of the sample by means of X-ray diffraction (before single crystallization), and FIG. 4 shows the result thereof (after single crystallization). (In FIG. 4, two peaks are observable in the vicinity of 2θ=45°. This is because the X-ray of target own is separated into $K\alpha_1$ and $K\alpha_2$.)

(Twelfth Embodiment)

The $BaTiO_3$ series single crystal, which is manufactured by the TSSG method and made available on the market as in the third embodiment, is cut 5×5×0.5 mm on the orientation plane (001), and this plane is polished to be the surface roughness Ra=0.3 nm and the flatness λ/4 to make it seed crystal. On the other hand, the $BaTiO_3$ (Ba/Ti=0.9945) powder, which is manufactured by the oxalate method, and the $PbTiO_3$ (Pb/Ti=0.9952) powder, which is manufactured by the solid-phase method, are blended in the ratio of 70.0 mol: 30.0 mol. While being crushed by means of pot mill, this powder is formed into a disc (of 16 mm diameter), and sintered at 1,200° C. for 1 hour $O^2$—HIP (atmosphere: 20% $O^2$ and pressure: 98 MPa) to produce the sintered member of $BaTiO_3$ of 70.0 mol %-$PbTiO_3$ of 30.0 mol %, the relative density of which is 99.96%. The sintered member thus obtained is composed of crystal grain of average diameter of approximately 4 μm. The mol ratio of elements contained in this sintered member is (Ba+Pb)/Ti=0.9947. The end face of this sintered member is mirror finished to be the surface roughness Ra=0.3 nm and the flatness λ/4. The polished surfaces of both seed crystal and sintered member are rinsed using acetone for mechanical coupling. Each one of PZT sintered member coupled with the sample is placed on a setter, and further, covered by an MgO crucible to form the atmosphere that contains Pb, and then, retained in the oxygen atmosphere at 1,330° C. for 20 hours, while keeping this state in the non-molten condition, for the execution of single crystallization. After the growing process, the single crystallization takes place from the surface coupled with the seed crystal to approximately 12 mm. The ratio of pore content is 3.8 volume % in the single crystal thus formed. The rearrangement density is found to be $7 \times 10^3/cm^2$ when examined by etching the sample in the HCl—HF solution.

(Thirteenth Embodiment)

$TiO_2$ (26.6246 g), PbO (3.7200 g), and $BaCO_3$ (62.4898 g) are wet blended, and after dried, tentatively burned at 1,100° C. for five hours, and, while being crushed, formed into a disc (of 20 mm diameter). For the compact powder member thus formed, the mol ratio of contained elements is (Ba+Pb)/Ti=0.9999. This powder is sintered at 1,300° C. for 10 hours to obtain the sintered member. The sintered member thus obtained is composed of bulky crystal grain of average granular diameter of approximately 2.2 mm. The composition of the sintered member is $BaTiO_3$ of 95.0 mol %-$PbTiO_3$ of 5.0 mol %. From this sintered member, the bulky crystal grain is drawn out as seed crystal, and the (111) plane of the crystal grain is cut out and finished with the surface roughness Ra=0.3 nm and the flatness λ/4. On the other hand, the same compound is formed into a disc of 10 mm diameter×20 mm thick, and sintered at 1,250° C. for three hours to obtain the sintered member of $BaTiO_3$ of 95.0 mol %-$PbTiO_3$ of 5.0 mol % in the relative density of 98.4%. The average granular diameter of the crystal grain that constitutes this sintered member is approximately 5 μm. The mol ratio of elements contained in this sintered member is (Ba+Pb)/Ti=0.9999. The end face of this sintered member is mirror finished to be the surface roughness Ra=0.3 nm and the flatness λ/4. The polished surfaces of both seed crystal and sintered member are rinsed using acetone for coupling by coating a mixed solution of $BaCl_3$ and $TiOCl_2$ (mixing ratio thereof=1: 0.5) on the coupling interface. While maintaining this state, these are retained at 1,350° C. for 20 hours in the non-molten condition for the execution of single crystallization. After the growing process, the single crystallization takes place from the surface coupled with the single crystal to approximately 12 mm.

From this result, it has been found that the growing speed is 0.60 mm/h, and that the growth is possible at a speed faster than the growing speed of the conventional melt-solidification method. Also, the ratio of pore content is 0.5 volume % in the single crystal of $BaTiO_3$ of 95.0 mol %-$PbTiO_3$ of 5.0 mol %, which is obtained by the sintered method using the seed crystal, and the rearrangement density is found to be $5 \times 10^2/cm^2$ when examined by etching it in the HCl—HF solution.

(Fourteenth Embodiment)

$TiO_2$ (26.8908 g), PbO (3.7200 g), and $BaCO_3$ (62.4898 g) are wet blended, and after dried, tentatively burned at 1,100° C. for five hours, and, while being crushed, formed into a disc (of 20 mm diameter). For the compact powder member thus formed, the mol ratio of contained elements is (Ba+Pb)/Ti=0.9990. This powder is sintered at 1,300° C. for 10 hours to obtain the sintered member. The sintered member thus obtained is composed of bulky crystal grain of average granular diameter of approximately 2.8 mm. The composition of the sintered member is $BaTiO_3$ of 95.0 mol %-PbTiO$_3$ of 5.0 mol %. From this sintered member, the bulky crystal grain is drawn out as seed crystal, and the (001) plane of the crystal grain is cut out and finished with the surface roughness Ra=0.3 nm and the flatness λ/4. On the other hand, the same compound is formed into a disc of 10 mm diameter×20 mm thick, and sintered at 1,250° C. for three hours to obtain the sintered member of BaTiO$_3$ of 95.0 mol %-PbTiO$_3$ of 5.0 mol % in the relative density of 98.7%. The average granular diameter of the crystal grain that constitutes this sintered member is approximately 6 μm. The mol ratio of elements contained in this sintered member is (Ba+Pb)/Ti=0.9990. The end face of this sintered member is mirror finished to be the surface roughness Ra=0.3 nm and the flatness λ/4. The polished surfaces of both seed crystal and sintered member are rinsed using acetone for coupling by coating a mixed solution of BaCl$_3$ and TiOCl$_2$ (mixing ratio thereof=1: 0.5) on the coupling interface. While maintaining this state, these are retained at 1,350° C. for 30 hours in the non-molten condition for the execution of single crystallization. After the growing process, the single crystallization takes place from the surface coupled with the single crystal to approximately 7 mm.

From this result, it has been found that the growing speed is 0.23 mm/h, and that the growth is possible at a speed faster than the growing speed of the conventional melt-solidification method. Also, the ratio of pore content is 0.6 volume % in the single crystal of BaTiO$_3$ of 95.0 mol %-PbTiO$_3$ of 5.0 mol %, which is obtained by the sintered method using the seed crystal, and the rearrangement density is found to be 1×10$^4$/cm$^2$ when examined by etching it in the HCl—HF solution.

(Fifteenth Embodiment)

BaTiO$_3$ (Ba/Ti=0.9954) powder, PbTiO$_3$ (Pb/Ti=1.0000) powder, and CaTiO$_3$ (Ca/Ti=1.0000) powder, which are manufactured by wet method, are wet blended in a mol ration of 70.0:29.0:1.0 in that order, and formed into a disc (of 20 mm diameter). For the compact powder member thus formed, the mol ratio of contained elements is (Ba+Pb)/Ti=0.9868. This powder is sintered at 1,350° C. for 10 hours to obtain the sintered member. The sintered member thus obtained is composed of bulky crystal grain of average granular diameter of approximately 3.3 mm. The composition of the sintered member is BaTiO$_3$ of 70.0 mol %-PbTiO$_3$ of 29.0 mol %-CaTiO$_3$ of 1.0 mol %. From this sintered member, the bulky crystal grain is drawn out as seed crystal, and the (001) plane of the crystal grain is cut out and finished with the surface roughness Ra=0.3 nm and the flatness λ/4. On the other hand, the same compound is formed into a disc of 10 mm diameter×20 mm thick, and sintered at 1,250° C. for three hours to obtain the sintered member of BaTiO$_3$ of 70.0 mol %-PbTiO$_3$ of 29.0 mol %-CaTiO$_3$ of 1.0 mol % in the relative density of 98.9%. The average granular diameter of the crystal grain that constitutes this sintered member is approximately 6 μm. The mol ratio of elements contained in this sintered member is (Ba+Pb)/Ti=0.9868. The end face of this sintered member is mirror finished to be the surface roughness Ra=0.3 nm and the flatness λ/4. The polished surfaces of both seed crystal and sintered member are rinsed using acetone, and then, coupled at 1,200° C. for one hour under a pressure of 9.8 MPa. The PZT sintered member is placed on a setter together with the coupled sample, and covered with an MgO crucible to form the lead atmosphere for the single crystallization at 1,350° C. for 50 hours. After the growing process, the single crystallization takes place from the surface coupled with the single crystal to approximately 11 mm.

From this result, it has been found that the growing speed is 0.22 mm/h. The ratio of pore content is 4.1 volume % in the single crystal of BaTiO$_3$ of 70.0 mol %-PbTiO$_3$ of 29.0 mol %-CaTiO$_3$ of 1.0 mol %, which is obtained by the sintered method. Also, the rearrangement density is found to be 1×10$^4$/cm$^2$ when examined by etching it in the HCl—HF solution.

(First Comparative Example)

TiO$_2$ (27.1652 g), PbO (3.7200 g), and BaCO$_3$ (62.4898 g) are wet blended, and after dried, tentatively burned at 1,110° C. for five hours, and, while being crushed, formed into a disc (of 16 mm diameter). For the compact powder member thus formed, the mol ratio of contained elements is (Ba+Pb)/Ti=0.9800. This powder is sintered at 1,350° C. for 30 hours to obtain the sintered member of BaTiO$_3$ of 95.0 mol %-PbTiO$_3$ of 5.0 mol %. The sintered member thus obtained is composed of crystal grain of average granular diameter of only 50 μm. Therefore, the same process as the third embodiment is given to the (100) plane of the BaTiO$_3$ series single crystal, which is grown by the TSSG method and made available on the market, to make it the seed crystal. On the other hand, the same compound is formed into a disc of 10 mm diameter×10 mm thick, and sintered at 1,250° C. for three hours to obtain the sintered member of BaTiO$_3$ of 95.0 mol %-PbTiO$_3$ of 5.0 mol % in the relative density of 98.1%. The average granular diameter of the crystal grain that constitutes this sintered member is approximately 12 μm. The mol ratio of elements contained in this sintered member is (Ba+Pb)/Ti=0.9800. The end face of this sintered member is mirror finished to be the surface roughness Ra=0.4 nm and the flatness λ/6 as in the third embodiment. The polished surfaces of both seed crystal and sintered member are rinsed using acetone for coupling by coating a solution of HNO$_3$ of 2N on the coupling interface. While maintaining this state, these are retained at 1,370° C. for 50 hours in the non-molten condition for the execution of single crystallization.

After the single crystal growing process, the single crystallization takes place from the surface coupled with the single crystal only to 100 μm. It is found from this result that the growing speed is 2×10$^{-3}$ mm/h, that almost no single crystallization has advanced.

(Second Comparative Example)

BaTiO$_3$ (Ba/Ti=1.0000) and PbTiO$_3$ (Pb/Ti=1.0100) powder is prepared by the coprecipitation method, and blended in a ration of 90.0 mol:10.0 mol. While being crushed by means of hot mill, this blended powder is formed into a disc (of 16 mm diameter). For the compact powder member thus formed, the mol ratio of contained elements is (Ba+Pb)/Ti=1.0010. This powder is sintered at 1,350° C. for 10 hours to obtain the sintered member of BaTiO$_3$ of 90.0 mol %-PbTiO$_3$ of 10.0 mol %. The sintered member thus obtained is composed of minute crystal grain of average granular diameter of approximately 3 μm, thus making it impossible to obtain the single crystal in a size sufficient enough to be used as seed crystal. Therefore, as in the case of the first comparative example, the BaTiO$_3$ series single crystal, which is grown by means of the TSSG method and made available on the market, is used as the seed crystal. On the other hand the same compound is formed into a disc of 10 mm diameter×15 mm thick, and sintered at 1,250° C. for three hours to obtain the sintered member of BaTiO$_3$ of 90.0 mol %-PbTiO$_3$ of 10.0 mol % in the relative density of 97.8%. The mol ratio of elements contained in this sintered member is (Ba+Pb)/Ti=1.0010. The end face of this sintered member is mirror finished to be the surface roughness Ra=0.4 nm and the flatness λ/6 as in the first comparative example. The polished surfaces of both seed crystal and sintered member are rinsed using acetone for coupling by coating a mixed solution of $BaCl_3$ and $TiOCl_2$ (mixing ratio: 1:1) on the coupling interface. While maintaining this state, these are retained at 1,390° C. for 30 hours in the non-molten condition for the execution of single crystallization. After this growing process, it is found that almost no single crystallization has taken place, but only in a width of approximately 1 to 2 grain (approximately 5 to 10 μm) from the surface coupled with the seed crystal.

(Third Comparative Example)

$BaTiO_3$—$PbTiO_3$ series single crystal is grown by means of the TSSG method. As the material of solution, the $BaTiO_3$ powder, $TiO_2$ powder, and $PbTiO_3$ powder, which are available on the market, are used. The sintered member is prepared using the material powder in a mol ratio of $BaTiO_3$: $TiO_2$: $PbTiO_3$=1:0.5:0.01. This sintered member is placed in a platinum crucible to melt the material by means of high-frequency induction heating. The growing temperature is 1,440° C. The $BaTiO_3$ seed crystal of <100> orientation, which is fixed to the platinum holer, is immersed in this solution, and the temperature is decreased at 0.4° C./h along with the rotation of 30 rpm, and the crystallization is performed by a speed of 0.1 mm/h. After approximately 200 hours, the drawing-up terminates when the temperature reaches 1,330° C. (eutectoid temperature). The crystal thus obtained is 25 mm diameter and 16 mm long (volume: 7.9 cm$^3$). The inside of the crystal is of porous structure (the ratio of pore content: 8 volume %) having many numbers of voids of several μm to several tens of μm created along with the Pb evaporation on the way of growth. With a microscope, the occurrence of many inclusions other than perovskite phase is observed. The rearrangement density in the crystal is 2×10$^6$/cm$^2$. It is larger than the rearrangement density of the $BaTiO_3$—$PbTiO_3$ series single crystal of the present invention. Also, the productivity is only 0.04 cm$^3$/h, which is approximately 1/100 as compared with the productivity of the $BaTiO_3$—$PbTiO_3$ series single crystal of the present invention.

As regards each of the embodiments described above, the Table 1 shows the various piezoelectric properties of the $BaTiO_3$—$PbTiO_3$ series single crystal manufactured particularly in the first, second, and six embodiments, the general PZT sintered member, the $BaTiO_3$ sintered member and $BaTiO_3$ series single crystal grown by means of the TSSG method, respectively.

Figure 1B:
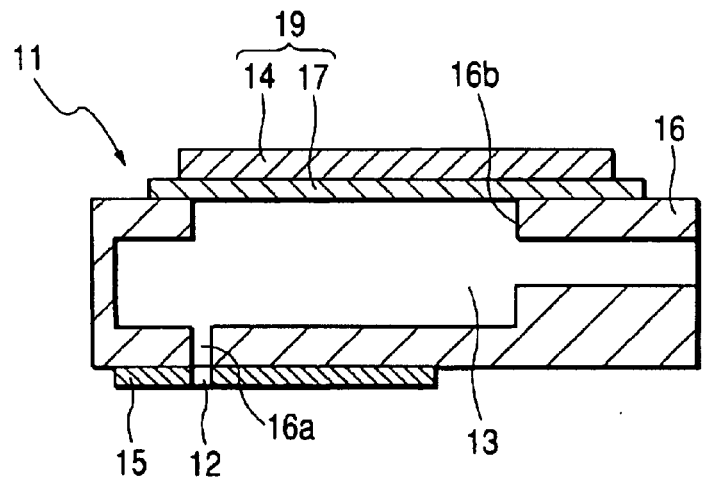
FIG. 1B is a cross-sectional view taken along line 1B—1B in FIG. 1A.
Figure 2A:
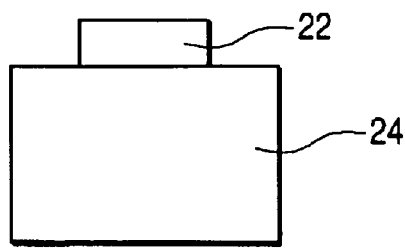
FIGS. 2A, 2B, 2C and 2D are the views of process flow that illustrate one example of the method for manufacturing $BaTiO_3$—$PbTiO_3$ series single crystal in accordance with the present invention.
Figure 2B:
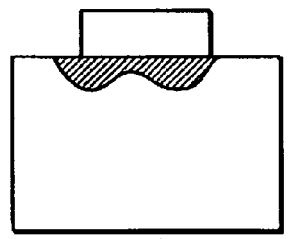
Figure 2C:
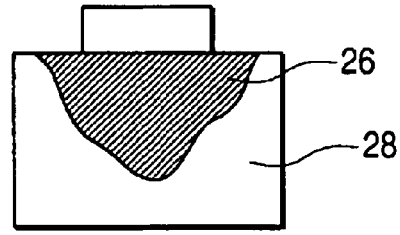
Figure 2D:
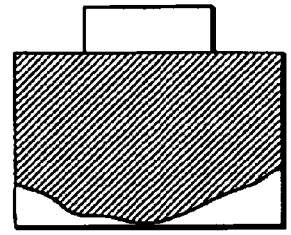

Next, with reference to FIGS. 1A and 1B, the description will be made of a piezoelectric type actuator (piezoelectric oscillator) using the $BaTiO_3$—$PbTiO_3$ series single crystal of the present invention, and a liquid discharge head using such piezoelectric type actuator. The liquid discharge head 11 shown in FIG. 1A and FIG. 1B is provided with a plurality of discharge ports 12; the liquid chamber 13 which is arranged corresponding to each discharge port 12; and the piezoelectric type actuator 19 which is arranged for each liquid chamber 13, respectively. The piezoelectric type actuator 19 comprises the piezoelectric member 14 that includes at least the layer formed by $BaTiO_3$—$PbTiO_3$ series single crystal; electrodes (not shown) of Pt, Au, Al, or the like formed on the surface of the piezoelectric member 14; and the oscillating plate 17 that is bonded with the piezoelectric member 14, thus forming a piezoelectric oscillator. Each liquid discharge port 12 for the liquid discharge head 11 is formed for a nozzle plate 15 at specific intervals. Each liquid chamber 13 is formed on the base plate portion 16 in parallel to each liquid discharge port 12 correspondingly. Each of the liquid discharge ports 12 and the corresponding liquid chamber 13 are connected through the liquid flow path 16a formed for the base plate portion 16, respectively. Also, on the upper face of the base plate portion 16, each opening portion 16b is formed corresponding to each of the liquid chambers 13, and on the upper face of base plate portion 16, the oscillating plate 17 is formed to cover each opening portion 16b. On this oscillating plate 17, the piezoelectric member 14 is arranged to be positioned corresponding to each liquid chamber 13.

For the liquid discharge head 11 structured as described above, the piezoelectric type actuator 19 is driven to press liquid in the corresponding liquid chamber 13 when driving signals are applied from outside to the piezoelectric type actuator 19, and liquid is discharged as liquid droplet from the liquid discharge port 12 communicated with the liquid chamber 13.

With the $BaTiO_3$—$PbTiO_3$ series single crystal, which is a piezoelectric material having a small amount of lead content therein, and used as the piezoelectric member (piezoelectric oscillator) that constitutes such piezoelectric type actuator, it becomes possible to obtain excellent piezoelectric properties at lower costs in much better condition than the PZT properties conventionally available. Further, it becomes possible to manufacture the environment-friendly piezoelectric type actuator (piezoelectric oscillator), and the liquid discharge head as well.

What is claimed is:

TABLE 1

Comparison of Specific Characteristics between the Present Invention and the Conventional Art

| Sample | Fist Embodiment $BaTiO_3$ of 99.0 mol % - $PbTiO_3$ of 1.0 mol % Single Crystal | Second Embodiment $BaTiO_3$ of 93.0 mol % - $PbTiO_3$ of 7.0 mol % Single Crystal | Sixth Embodiment $BaTiO_3$ of 75.0 mol % - $PbTiO_3$ of 25.0 mol % Single Crystal | Comparative Example PZT Sintered Member | Comparative Example $BaTiO_3$ Series Sintered Member | Comparative Example $BaTiO_3$ Series Single Crystal |
|---|---|---|---|---|---|---|
| Curie Temperature (° C.) | 125 | 155 | 246 | 290 | 120 | 120 |
| Permittivity after Polarization | 3900 | 2700 | 1500 | 300 | 3000 | 4700 |
| Dielectric Loss (%) | 0.30 | 0.28 | 0.19 | 1.9 | 2.5 | 0.25 |
| Coupling Coefficient $k_{33}$ (%) | 86 | 89 | 91 | 71 | 48 | 85 |
| Piezoelectric Constant $d_{33}$ (pC/N) | 520 | 580 | 620 | 290 | 118 | 500 |
| Amount of Induced Distortion (%) Field 30 (kV · cm) | 0.92 | 1.25 | 1.69 | 0.11 | 0.06 | 0.90 |

1. A method for manufacturing $BaTiO_3$—$PbTiO_3$ series single crystal comprising the steps of:

providing a $BaTiO_3$—$PbTiO_3$ compact powder or sintered substance having a smaller Pb content mole number than Ba content mole number by defining the range of the molar ratio of elements contained therein to be $0.9800<(Ba+Pb)/Ti<1.0000$; and heating said compact powder or sintered substance, while keeping said compact powder or sintered substance in non-molten condition.

2. A method for manufacturing $BaTiO_3$—$PbTiO_3$ series single crystal according to claim 1, wherein the range of the molar ratio of elements contained in said compact powder or sintered substance is $0.9900<(Ba+Pb)/Ti<0.9999$.

3. A method for manufacturing $BaTiO_3$—$PbTiO_3$ series single crystal according to claim 2, wherein the range of the molar ratio of elements contained in said compact powder or sintered substance is $0.9950\leq(Ba+Pb)/Ti\leq1.0000$.

4. A method for manufacturing $BaTiO_3$—$PbTiO_3$ series single crystal according to claim 1, wherein the ratio of $PbTiO_3$ content in said compact powder or sintered substance is 45 mol % or less.

5. A method for manufacturing $BaTiO_3$—$PbTiO_3$ series single crystal according to claim 4, wherein the ratio of $PbTiO_3$ content in said compact powder or sintered substance is 30 mol % or less.

6. A method for manufacturing $BaTiO_3$—$PbTiO_3$ series single crystal according to claim 5, wherein the ratio of $PbTiO_3$ content in said compact powder or sintered substance is 25 mol % or less.

7. A method for manufacturing $BaTiO_3$—$PbTiO_3$ series single crystal according to claim 1, comprising the step of:

single-crystallizing by heating said compact powder or sintered substance within a temperature range of 1,200° C. or more and 1,400° C. or less.

8. A method for manufacturing $BaTiO_3$—$PbTiO_3$ series single crystal according to claim 1, wherein a compound containing lead is inserted into a furnace during the single crystal growing process to generate steam containing Pb for the growth of $BaTiO_3$—$PbTiO_3$ series single crystal.

9. A method for manufacturing $BaTiO_3$—$PbTiO_3$ series single crystal according to claim 8, comprising the step of:

single-crystallizing by heating, while keeping said compact powder or sintered substance in the lead atmosphere and in non-molten condition.

10. A method for manufacturing $BaTiO_3$—$PbTiO_3$ series single crystal according to claim 8, wherein the molar ratio of elements contained in said sintered substance is within a range of $0.9950\leq(Ba+Pb)/Ti\leq0.9999$.

11. A method for manufacturing $BaTiO_3$—$PbTiO_3$ series single crystal according to claim 1, comprising the steps of:

preparing $BaTiO_3$ series single crystal or $BaTiO_3$—$PbTiO_3$ series single crystal as seed crystal;

coupling $BaTiO_3$—$PbTiO_3$ series sintered member composed of crystal grain of average granular diameter of 20 μm or less, having the relative density of 95% or more, with the {100} plane, {110} plane, or {111} plane of said seed crystal; and single-crystallizing by heating, while keeping said coupled substance in non-molten condition.

12. A method for manufacturing $BaTiO_3$—$PbTiO_3$ series single crystal according to claim 11, wherein a compound containing lead is inserted into a furnace during the single crystal growing process to generate steam containing Pb for the growth of $BaTiO_3$—$PbTiO_3$ series single crystal.

* * * * *

UNITED STATES PATENT AND TRADEMARK OFFICE
CERTIFICATE OF CORRECTION

PATENT NO. : 6,783,588 B2
DATED : August 31, 2004
INVENTOR(S) : Hiroshi Aoto et al.

It is certified that error appears in the above-identified patent and that said Letters Patent is hereby corrected as shown below:

Title page, Item [54] and Column 1, line 3,
Title, "SAME" should read -- SAME, --.

Title page,
Item [56], References Cited, FOREIGN PATENT DOCUMENTS, "4-3200296" should read -- 4-300296 --; and "9-163496" should read -- 9-263496 --.

Column 2,
Line 57, "tion" should read -- tion. --.

Signed and Sealed this

Twenty-first Day of December, 2004

JON W. DUDAS
*Director of the United States Patent and Trademark Office*